(12) United States Patent
Jeon et al.

(10) Patent No.: US 7,452,923 B2
(45) Date of Patent: Nov. 18, 2008

(54) ANISOTROPIC CONDUCTIVE ADHESIVE

(75) Inventors: Young Mi Jeon, Gyeonggi-do (KR);
Yoon Jae Chung, Gyeonggi-do (KR);
Jong Yoon Jang, Gyeonggi-do (KR);
Woo Young Ahn, Gyeonggi-do (KR);
Yong Seok Han, Gyeonggi-do (KR)

(73) Assignee: LG Cable Ltd., Seoul (KR)

( * ) Notice: Subject to any disclaimer, the term of this patent is extended or adjusted under 35 U.S.C. 154(b) by 410 days.

(21) Appl. No.: 10/958,825

(22) Filed: Oct. 5, 2004

(65) Prior Publication Data
US 2005/0288427 A1   Dec. 29, 2005

(30) Foreign Application Priority Data
Jun. 23, 2004   (KR) .................. 10-2004-0047195

(51) Int. Cl.
*C08F 2/50*   (2006.01)
*H01B 1/00*   (2006.01)
*H01B 1/20*   (2006.01)
*H01B 1/22*   (2006.01)

(52) U.S. Cl. .................. 522/90; 522/96; 522/100; 522/102; 522/103; 522/104; 522/106; 522/107; 522/150; 522/152; 522/153; 522/154; 522/157; 522/158; 522/159; 522/160; 522/161; 522/109; 522/110; 522/111; 522/112; 522/71; 522/81; 252/500; 252/510; 252/511

(58) Field of Classification Search .......... 522/109, 522/110, 111, 112, 90, 95, 100, 102, 103, 522/104, 106, 107, 150, 152, 153, 154, 157, 522/158, 159, 160, 161, 71, 81; 252/500, 252/510, 511

See application file for complete search history.

(56) References Cited

U.S. PATENT DOCUMENTS

| 6,140,396 | A | * | 10/2000 | Sugioka et al. | ............... | 524/99 |
| 6,592,783 | B2 | * | 7/2003 | Kumakura et al. | .......... | 252/500 |
| 2003/0102466 | A1 | * | 6/2003 | Kumakura et al. | .......... | 252/511 |
| 2006/0054277 | A1 | * | 3/2006 | Byun et al. | .................. | 156/327 |

FOREIGN PATENT DOCUMENTS

| JP | 62-141083 |   | 6/1987 |
| JP | 10-147762 |   | 6/1998 |
| JP | 11-329069 | A * | 11/1999 |

* cited by examiner

*Primary Examiner*—Sanza L McClendon
(74) *Attorney, Agent, or Firm*—DeMont & Breyer, LLC

(57) ABSTRACT

The present invention discloses an anisotropic conductive adhesive comprising an insulating adhesive component and a number of conductive particles dispersed in the insulating adhesive component, wherein the insulating adhesive component contains a crosslinked rubber resin. The anisotropic conductive adhesive of the present invention prevents exfoliation of an adhesive or reduction in adhesive strength of circuit by minimizing its the heat-contraction occurring in the process of a polymerization or a hardening reaction when connecting micro-circuits, whereby a short circuit between adjacent electrodes can be prevented when connecting the circuits, and excellent connection reliability according to a long-term use is achieved.

8 Claims, 1 Drawing Sheet

ANISOTROPIC CONDUCTIVE ADHESIVE

CROSS-REFERENCE TO RELATED APPLICATIONS

This application claims priority of Republic of Korea patent application number KR 10-2004-0047195, filed Jun. 23, 2004, which is incorporated by reference.

BACKGROUND OF THE INVENTION

1. Field of the Invention

The present invention relates to an anisotropic conductive adhesive and an adhesive film using the same, and more particularly to an anisotropic conductive adhesive and an adhesive film using the same, which is characterized by including a crosslinked rubber resin in an insulating adhesive component.

2. Background of the Related Art

An anisotropic conductive adhesive is a circuit connecting material in which conductive particles are dispersed in an insulating adhesive component, which adheres mechanically circuits disposed in the opposite direction, and simultaneously interposes a conductive particle between the circuit electrodes to establish an electrical connection. As an insulating adhesive component, a thermoplastic resin and a thermosetting resin are usable, and the thermosetting resin is more preferably used in terms of connection reliability In case of employing the thermosetting resin as an adhesive component, a connection is made by interposing an anisotropic conductive adhesive between connected-to-be-members, which is then heat-compressed. But this method needs a significantly long hardening reaction time at high temperature for obtaining improved connection reliability and sufficient adhesive strength. Typically, in case of epoxy resins, about 20 seconds at 140~180° C. or about 10 seconds at 180~210° C. is necessary for connection.

However, under these connection conditions, there has been a problem in that dropping-out of wirings, short circuit between adjacent electrodes, dislocation and the like occur. Recently in the field of precise electronic equipments, since the development of ultra-dense circuit is in progress, electrode width and electrode spacing are becoming very narrow, which makes these problems deepened. Also, a long-term connection lowers production efficiency, and for the efficiency improvement, 10 seconds or less of connection time is required.

Also, in order to overcome the above-mentioned problems, a connecting material using a radical polymerizable resin has been developed, in which a radical polymerization occurs by heating or light-hardening at low temperature, and then hardening is made by cross-link. But there is still a problem in that since contraction of the connecting material by polymerization occurs greatly, internal stress is accumulated in a connection part after hardening, which causes easy exfoliation of the connecting material. Also, in the case where an electrode spacing is narrow, the electrode spacing is reduced by the contraction of the connecting material, which causes a short circuit.

SUMMARY OF THE INVENTION

Therefore, the present invention has been made in view of the above problems, and it is an object of the present invention to provide an anisotropic conductive adhesive which minimizes its contraction which occurs in the process of a polymerization or a hardening reaction when connecting circuits by using the anisotropic conductive adhesive, thereby preventing a short circuit due to exfoliation of an adhesive or movement of an electrode, and achieving excellent connection reliability according to a long-term use.

Another object of the present invention is to provide an adhesive film using such a anisotropic conductive adhesive.

To accomplish the above objects, according to the present invention, there is provided an anisotropic conductive adhesive including: an insulating adhesive component and a number of conductive particles dispersed in the insulating adhesive component, wherein the insulating adhesive component contains a crosslinked rubber resin.

The anisotropic conductive adhesive may be used in the form of film, paste or powder.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiment of the present invention with reference to the attached drawings.

Figure 1:
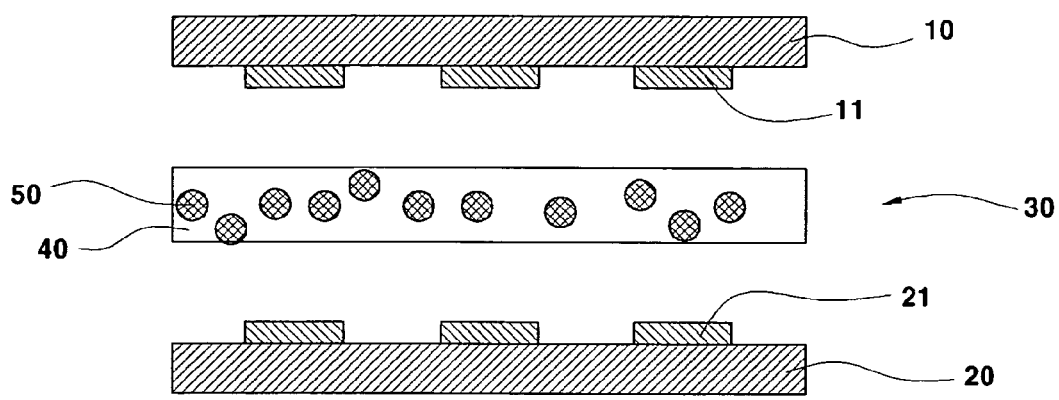
FIG. 1 is a schematic diagram of anisotropic conductive adhesive film in accordance with the present invention.

FIG. 1 is a schematic diagram of anisotropic conductive adhesive film in accordance with an embodiment of the present invention. As shown in FIG. 1, an adhesive film 30 made using an anisotropic conductive adhesive is composed of an insulating adhesive component 40 including a crosslinked rubber resin and conductive particles 50.

In the anisotropic conductive adhesive according to the present invention, the crosslinked rubber resin may be at least one selected from the group consisting of olefin resin, butadiene resin, acrylonitrile butadiene copolymer, styrene butadiene styrene copolymer, isobutylene isoprene copolymer (IIR), nitrile butadiene rubber resin, chloroprene rubber resin, vinyl butylal resin, silicon rubber resin and a mixture of thereof.

Preferably, the olefin resin may be selected from the group consisting of ethylene resin, butyl rubber resin, ethylene propylene copolymer (EPDM), etc.

In the anisotropic conductive adhesive according to the present invention, the content of the crosslinked rubber resin is preferably 1~20 parts by weight, based on 100 parts by weight of an insulating adhesive component.

If the content of the crosslinked rubber resin component is 20 parts by weight or more, there is a problem in that elastic recovery force and hardening density is too great, which results in an reduction in adhesive force, and if it is 1 part by weight or less, there is a problem in that the hardening reaction is not sufficiently carried out when connecting circuits.

The crosslinked rubber resin of the present invention allows an anisotropic conductive adhesive to prevent the exfoliation of an adhesive or the reduction in adhesive strength of circuit and achieve excellent connection reliability according to long-term use by minimizing the contraction of the anisotropic conductive adhesive which occurs in the process of a polymerization or a hardening reaction when connecting circuits by using an anisotropic conductive adhesive.

The insulating adhesive component of the anisotropic conductive adhesive of the present invention may be selected from the group consisting of thermoplastic resin, thermosetting resin, radical polymerizable resin and a mixture thereof.

The thermoplastic resin may be selected from the group consisting of stylene butadiene resin, ethylene vinyl resin, ester-based resin, silicon resin, phenoxy resin, acryl-based resin, amid-based resin or acylate-based resin, polyvinylbutylal resin, etc.

The thermosetting resin may be selected from the group consisting of epoxy resin, phenol resin, melamin resin, etc. The epoxy resin may be selected from the group consisting of bisphenol-type epoxy resin, cresolnovolak-type epoxy resin, aliphatic polyepoxy resin, dimer acid modified epoxy resin, etc.

In case of including a thermoplastic resin in an adhesive component of the present invention, a curing agent is used, wherein the curing agent is inert at room temperature, and is activated after heating and melting, followed by hardening the thermosetting resin. The curing agent may be imidazole modification (amine derivative containing hetero-ring), dibasic acid dihydrazid, dicyandiamide, etc. The content of the curing agent is 1~200 parts by weight, based on 100 parts by weight of a thermosetting agent.

The radical polymerizable resin may be monomer or oligomer, etc. which is a material having radical group, polymerizable by radical, wherein monomer and oligomer can be used together. The radical polymerizable resin may be acrylate-based compound such as methylacrylate, ethylacrylate, bisphenol A ethylene glycol modified diacrylate, isocyanuric acid ethylene glycol modified diacrylate, tripropylene glycol diacrylate, tetraethylene glycol diacrylate, polyethylglycol diacrylate, pentaerythritol triacrylate, trimethylolpropanetriacrylate, trimethylolpropanepropylene glycol triacylate, trimethylolpropaneethylene glycol triacrylate, isocyanuric acid ethylene glycol modified triacrylate, dipentaerythritolpentaacylate, dipentaerythritolhexaacylate, pentaerylthritoltetraacrylate, dicyclopentenylacrylate, tricyclodecanylacylate, and the like, methacylate compound, maleimide compound, unsaturated polyester, acryl acid, vinylacetate, acylonitrile, methacrylonitrile compound, etc.

In case of including a radical polymerizable resin in an adhesive component in the present invention, a polymerization initiator is employed to activate the radical polymerizable resin, which conducts to form a net structure or an IPN structure of polymer, thereby as forming this crosslinked structure, an insulating adhesive component is hardened. The polymerization initiator may be thermal polymerization initiator such as a peroxide compound and/or photopolymerization initiator such as carbonyl compound, sulfur compound and azo compound. The content of the polymerization initiator may be controlled depending upon a kind of radical polymerizable resin, and the reliability and operation efficiency of the adhesive process of the objective circuit. But the content thereof is preferably 0.1~10 parts by weight, based on 100 parts by weight of radical polymerizable resin.

Also, if necessary, a filler, a softening agent, an accelerator, a staining agent, a flame retardant, a light stabilizer, a coupling agent, a polymerization-inhibiting agent and so on may be further added into the adhesive component of an anisotropic conductive adhesive of the present invention. For example, the addition of a filler may improve an connecting reliability, etc. And the addition of a coupling agent may improve the boding properties of the adhesive interface of the anisotropic conductive adhesive, an adhesive strength, a thermal resistance and a moisture-proof, thereby improving the connecting reliability. Such coupling agent may be a silane coupling agent which is, for example, beta-(3,4 epoxycyclohexyl)ethyltrimethoxysilane, gamma-mercaptopropyltrimethoxysilane, gamma-methacyloxytropyltrimethoxysilane, etc.

A number of conductive particles dispersed in the insulating adhesive component of the present invention may be a metal such as nickel, iron, copper, aluminum, tartar, zinc, chrome, cobalt, silver, gold, etc.; or a conductive particle itself such as metalic oxide, solder, carbon, etc.; or a particle in which a metal thin layer is formed on the nuclear material surface of glass, ceramic, polymer, etc., through a method for forming a thin layer such as an electroless plating; or a particle covered with an insulating resin on the surface of the particle in which a metal thin layer is formed on the nuclear material surface or the conductive particle itself.

The diameter of the conductive particle is depends on a pitch of circuits to be connected, etc., which is preferably 1~20 μm, more preferably 2~10 μm.

The content of the conductive particle is preferably 0.1~5% by volume relative to that of an adhesive component containing the crosslinked rubber resin. If it is 0.1% by volume or less, since the amount of the conductive particles existing between the connecting circuits is small, the connecting reliability is lowered, and if it is 5% by volume or more, a short circuit can easily occur between adjacent electrodes in case of connecting micro-circuits.

Hereinafter, the operation of the present invention when connecting circuits using the inventive anisotropic conductive adhesive will be described.

Referring to FIG. 1, a number of conductive particles are dispersed in an insulating adhesive component in an anisotropic conductive adhesive of the present invention.

First of all, the anisotropic conductive adhesive is interposed between an upper substrate 10 and a lower substrate 20, which have circuit electrodes formed thereon oriented oppositely to each other (FIG. 1), respectively.

Subsequently, when a laminated structure consisting of the upper substrate 10, the anisotropic conductive adhesive and the lower substrate is thermally compressed at predetermined temperature and pressure, the circuit electrodes is electrically connected to each other through the conductive particles prior to hardening of the insulating adhesive component.

Figure 2:
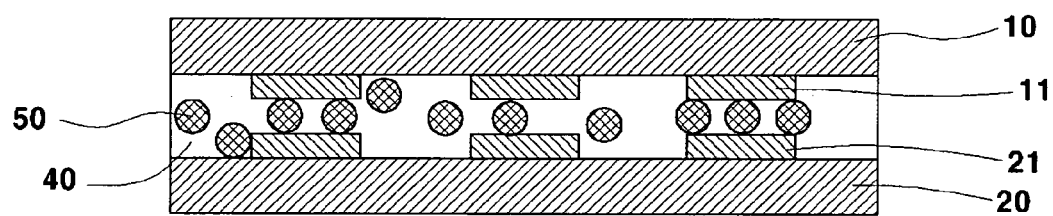
FIG. 2 is a schematic diagram showing a state in which a flexible circuit board and a print circuit board are adhered to both sides of the anisotropic conductive adhesive film in accordance with the present invention.

After that, after completely hardening the insulating adhesive component, the upper and the lower substrates are securely adhered and fixed to each other, so that the circuit electrodes oriented oppositely to each other are electrically connected by the anisotropic conductive adhesive according to the present invention, and a circuit connected structure with high reliability is fabricated (FIG. 2).

Hereinafter, the present invention will be described in detail referring to the following examples. However, the examples according to the present invention can be modified in other forms, and the scope of the present invention is not limited to the following examples. The examples of the present invention are provided to illustrate further completely this invention to a person with ordinary skill in the art.

EXAMPLE 1

50 g of phenoxy resin (Inchem Inc., PKHC, average molecular weight 45,000) was dissolved in a mixed solvent of toluene (boiling point: 110.6° C., SP value: 8.90) and acetone (boiling point: 56.1° C., SP value: 10.0) with the weight ratio of 50/50, and a solution, in which the content of a solid powder is 40%, was prepared. Subsequently, 25 g of ethylene glycol modified bisphenol A diacrylate (Donga Synthesis Co., M-210) as a radical polymerizable resin, 5 g of t-hexylperoxy-2-ethylhexanoate (Nippon ushi Inc., percure HO) as an initiator, and 7 g of EPDM (Kumhopolychem Co., Vistalon 503K) as a crosslinked rubber resin having ML1+4@100°C. : 34 of Mooney viscosity were added to the prepared solution. Conductive particles comprising a metal covered resin particle (Jeoksoo Chemical Co., Micropearl AU205, 5.0 μm) were added to the resulting solution to be 3% by volume of the adhesive component, followed by dispersing uniformly, and then an anisotropic conductive adhesive was prepared. After that, the anisotropic conductive adhesive was coated on a PET film, one side of which is 50 μm thick and was releasing-treated, by using a control coater, followed by hot-blast drying at 70° C. for 10 minutes, and then an anisotropic conductive adhesive film in which the adhesive layer has a thickness of 35 μm was obtained.

EXAMPLE 2

An anisotropic conductive adhesive film was prepared with the same method as Example 1, except adding 7 g of EPDM rubber resin (Kumhopolychem Co., KEP-330, Mooney viscosity: ML1+4@100° C.:34) as a crosslinked rubber resin.

EXAMPLE 3

An anisotropic conductive adhesive film was prepared with the same method as Example 1, except adding 7 g of butyl rubber resin (InterService Co., BK-1675N, Mooney viscosity: ML1+8@125° C.:47-54) as a crosslinked rubber resin.

COMPARATIVE EXAMPLE 1

An anisotropic conductive adhesive film was prepared with the same method as Example 1, except not adding a crosslinked rubber resin.

COMPARATIVE EXAMPLE 2

An anisotropic conductive adhesive film was prepared with the same method as Example 1, except adding SBR rubber resin (SEETEC Co., SB 1500H, Mooney viscosity: ML1+4@100° C.:52), which was not a crosslinked rubber resin, instead of an EPDM rubber resin as a crosslinked rubber resin.

COMPARATIVE EXAMPLE 3

An anisotropic conductive adhesive film was prepared with the same method as Example 1, except adding NBR rubber resin (Zeon Co., N21L, Mooney viscosity: ML1+4@100° C.:62.5), which was not a crosslinked rubber resin, instead of an EPDM rubber resin as a crosslinked rubber resin.

The anisotropic conductive adhesive film prepared by Examples 1-3 and Comparative Examples 1-3 were interposed between flexible printed circuit boards (FPC) having 500 of copper pattern with 50 μm width, 100 μm pitch and 18 μm thickness. And the adhesive side of the anisotropic conductive adhesive film was attached to the one side of the FPC, and thermally-compressed at 70° C., 5 kg/cm² for 5 seconds, and provisionally connected with 2 mm width, and PET film was exfoliated, which is then connected with other side of the FPC, so that the circuits were connected, followed by thermally-compressing at 160° C., 30 kg/cm² for 10 seconds, and a circuit connected structure was obtained.

The manufactured circuit connected structure was left to stand at a temperature of 65° C., a relative humidity of 95% for 1000 hours. Thereafter, adhesive strength and connection resistance were measured. Also, the occurrence rate of short circuit was measured by compressing each specimen comprising 100 sheets. The results are presented in the following Table 1.

TABLE 1

| | Adhesive strength (gf/cm) | | Connection resistance (Ω) | | |
|---|---|---|---|---|---|
| | Initial stage | After environmental test | Initial stage | After environmental test | No. of short occurrence |
| Example 1 | 1310 | 1100 | 1.88 | 2.00 | — |
| Example 2 | 1320 | 1250 | 1.89 | 1.99 | — |
| Example 3 | 1290 | 1010 | 1.85 | 2.00 | — |
| Comparative Example 1 | 971 | 750 | 1.89 | 3.01 | 6 |
| Comparative Example 2 | 1015 | 940 | 1.85 | 2.35 | 2 |
| Comparative Example 3 | 1020 | 910 | 1.98 | 3.29 | 2 |

With reference to Table 1, it can be seen that the circuit connected structure using the anisotropic conductive adhesive of Examples 1-3 according to the present invention was good for adhesive strength, current resistance and short occurrence rate.

On the other hand, it can be seen that in Comparative Examples 1-3, a short circuit occurred in all of them, and the adhesive strength and the current resistance is more inferior to Examples 1-3 using the anisotropic conductive adhesive of the present invention.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An anisotropic conductive adhesive comprising an insulating adhesive component and a number of conductive particles, dispersed in the insulating adhesive component,
   wherein the insulating adhesive component contains a crosslinked rubber resin, a radical polymerizable resin, and a polymerization initiator, as well as at least one additive selected from the group consisting of
   i) a filler,
   ii) a softening agent,
   iii) an accelerator,
   iv) a staining agent,
   v) a flame retardant,
   vi) a light stabilizer,
   vii) a coupling agent selected from the group consisting of
      a) beta-(3,4 epoxycyclohexyl)ethyltrimethoxysilane,
      b) gamma-mercaptopropyltrimethoxysilane, and
      c) gamma-methacyloxytropyltrimethoxysilane, and
   viii) a polymerization-inhibiting agent;
   wherein the crosslinked rubber resin is at least one selected from the group consisting of olefin resin, butadiene resin, acrylonitrile butadiene copolymer, styrene butadiene styrene copolymer, isobutylene isoprene copolymer(IIR), nitrile butadiene rubber resin, chloroprene rubber resin, vinyl butylal resin, silicon rubber resin and a mixture thereof;

wherein the radical polymerizable resin is a monomer, an oligomer or both thereof, which is a material having radical group, polymerizable by radical; and wherein the polymerization initiator is a thermal polymerization initiator such as a carbonyl compound, a sulfur compound, and an azo compound.

2. The anisotropic conductive adhesive according to claim 1, wherein the diameter of each conductive particle is 2~10μm.

3. The anisotropic conductive adhesive according to claim 1, wherein the olefin resin is selected from the group consisting of ethylene resin, butyl rubber resin and ethylene propylene copolymer(EPDM).

4. The anisotropic conductive adhesive according to claim 1, wherein the content of the crosslinked rubber resin is 1~20 parts by weight, based on 100 parts by weight of an insulating adhesive component.

5. The anisotropic conductive adhesive according to claim 1, wherein the radical polymerizable resin is selected from the group consisting of acrylate-based compound such as methylacrylate, ethylacrylate, bisphenol A ethylene glycol modified diacrylate, isocyanuric acid ethylene glycol modified diacrylate, tripropylene glycol diacrylate, tetraethylene glycol diacrylate, polyethylglycol diacrylate, pentaerythritol triacrylate, trimethylolpropanetriacrylate, trimethylolpropanepropylene glycol triacylate, trimethylolpropaneethylene glycol triacrylate, isocyanuric acid ethylene glycol modified triacrylate, dipentaerythritolpentaacylate, dipentaerythritolhexaacylate, pentaerylthritoltetraacrylate, dicyclopentenylacrylate, tricyclodecanylacylate, and the like, methacylate compound, maleimide compound, unsaturated polyester, acryl acid, vinylacetate, acylonitrile, methacrylonitrile compound.

6. The anisotropic conductive adhesive according to claim 1, wherein the content of the polymerization initiator is 0.1~10 parts by weight, based on 100 parts by weight of the radical polymerizable resin.

7. The anisotropic conductive adhesive according to claim 1, wherein the anisotropic conductive adhesive is a film type.

8. The anisotropic conductive adhesive according to claim 1, wherein the content of the conductive particles is 0.1~5% by volume relative to that of the adhesive component containing the crosslinked rubber resin.

* * * * *